United States Patent [19]
Takabayashi et al.

[11] Patent Number: 5,352,318
[45] Date of Patent: Oct. 4, 1994

[54] METHOD OF MUTUALLY CONNECTING ELECTRODE TERMINALS

[75] Inventors: Hiroshi Takabayashi, Kawasaki; Masanori Takahashi, Atsugi, both of Japan

[73] Assignee: Canon Kabushiki Kaisha, Tokyo, Japan

[21] Appl. No.: 12,805

[22] Filed: Feb. 2, 1993

Related U.S. Application Data

[63] Continuation of Ser. No. 566,115, Aug. 13, 1990, abandoned.

[30] Foreign Application Priority Data

| Aug. 17, 1989 | [JP] | Japan | 1-210584 |
| Aug. 24, 1989 | [JP] | Japan | 1-216140 |
| Dec. 15, 1989 | [JP] | Japan | 1-324983 |
| Jul. 23, 1990 | [JP] | Japan | 2-195332 |

[51] Int. Cl.$^5$ .............. B32B 31/00; B05D 5/12; H01L 21/44
[52] U.S. Cl. .............. 156/272.6; 156/273.1; 156/273.3; 156/273.9; 156/275.3; 437/183; 427/96; 427/71; 427/282; 427/205; 427/199
[58] Field of Search ........ 156/272.2, 272.4, 272.6, 156/273.1, 273.3, 273.9, 275.1, 275.3, 275.7, 151, 291, 295, 277; 437/188, 183, 180; 427/96, 71, 282, 205, 259, 199

[56] References Cited

U.S. PATENT DOCUMENTS

| 3,923,581 | 12/1975 | Payne et al. | 156/291 |
| 4,049,844 | 9/1977 | Bolon et al. | 427/96 X |
| 4,314,870 | 2/1982 | Ishida | 156/272.2 |
| 4,414,603 | 11/1983 | Masuda | 361/227 |
| 4,744,850 | 5/1988 | Imano et al. | 156/273.9 X |
| 4,857,482 | 8/1989 | Saito et al. | 437/209 |
| 4,971,829 | 11/1990 | Komura et al. | 427/27 |
| 5,034,245 | 7/1991 | Matsubara | 427/96 X |

FOREIGN PATENT DOCUMENTS

| 3414961 | 10/1984 | Fed. Rep. of Germany . |
| 2620569 | 3/1989 | France . |
| 58-52864 | 3/1983 | Japan . |
| 61-289650 | 12/1986 | Japan | 437/183 |
| 62-174932 | 7/1987 | Japan | 437/183 |

OTHER PUBLICATIONS

M. Masuda, et al., "Chip on Glass Technology for Large Capacity and High Resolution LCD," Proceedings of the IEEE/CHMI 1989 International Electronic Manufacturing Technology Symposium, pp. 55–58 (Apr. 1989).

*Primary Examiner*—Chester T. Barry
*Attorney, Agent, or Firm*—Fitzpatrick, Cella, Harper & Scinto

[57] ABSTRACT

Electrode terminals formed on a pair of a circuit substrate and another circuit substrate or electrical element are mutually connected electrically by the medium of electroconductive particles. Prior to the connection, the electroconductive particles may be charged and dispersed onto a circuit substrate to be selectively attached to the electrode terminals thereon. The selective attachment may be enhanced by masking a part other than the connecting part of the electrode terminals of the circuit substrate with an insulating member or film so as to guide the charged electroconductive particles along electric lines of force directed to the exposed parts of the electrode terminals. The attached electroconductive particles are sandwiched between the pair of circuit substrates, which may be secured to each other by an insulating adhesive or an electroconductive resin.

24 Claims, 9 Drawing Sheets

METHOD OF MUTUALLY CONNECTING ELECTRODE TERMINALS

This application is a continuation of application Ser. No. 07/566,115, filed Aug. 13, 1990, now abandoned.

FIELD OF THE INVENTION AND RELATED ART

The present invention relates to a method of mutually connecting electrically electrode terminals of circuit plates or substrates disposed opposite to each other by electroconductive (fine) particles. The present invention further relates to a method of connecting a semiconductor device or chip to a circuit plate or substrate by the face-down bonding mode.

Heretofore, an anisotropically conductive adhesive film has been used for mutually connecting lead or takeout electrodes disposed on circuit substrates at a density of about 5 lines/mm.

Particularly, in order to connect a driver semiconductor device onto a liquid crystal display device, there has been practiced a method wherein the semiconductor device is bonded to a TAB (tape-automated bonding) film, and the lead electrodes of the TAB film and the lead electrodes of the liquid crystal display device are bonded by using an anisotropically conductive adhesive film.

Further, in order to connect a semiconductor device onto lead electrodes on a glass substrate of a liquid crystal display device, there has been used a method of using solder bumps formed on electrode pads of the semiconductor device for the connection or a method of using gold bumps on electrode terminals of the semiconductor device for the connection with an adhesive or a pressure bonding member.

However, the connection using an anisotropically conductive adhesive film involves a problem that insulation between adjacent electrodes is not ensured if the connection terminal density is increased to 10 electrodes or more per mm.

Further, in the case where a semiconductor device is directly connected to a circuit substrate for a liquid crystal display, etc., it is necessary to form bumps contacts, resulting in difficulties that the production cost is increased and the production yield is lowered and also resulting in the difficulty that the bump contacts cannot fully absorb a stress acting between the semiconductor device and the substrate so that the reliability is lowered.

Further, in order to connect a semiconductor device onto a circuit substrate by the face-down bonding mode, there has been used a method of forming solder bumps on the electrode pads of the semiconductor device for the connection or a method of forming gold bumps on the electrode pads of the semiconductor device of the connection with an adhesive or a pressure bonding member. However, the formation of bump contacts on the semiconductor device is again accompanied with an increase in production cost and a decrease in production yield and further accompanied with the difficulty that the bump contacts cannot fully absorp a stress between the semiconductor device and the circuit substrate so that the reliability is lowered.

SUMMARY OF THE INVENTION

A principal object of the present invention is to provide a method of mutually connecting electrode terminals by which a reliable connection is provided even when applied to electrode terminals disposed at a high density and which can be performed economically to provide a high production yield.

Another object of the present invention is to provide a method of connecting a semiconductor device by which a semiconductor device is connected to a circuit substrate without forming bump contacts on the semiconductor device, thus providing an increased production yield of the semiconductor device, a decrease in production cost and an increased reliability, even when the connection is effected by the face-down bonding mode.

According to a first aspect of the present invention, there is provided a method of mutually connecting electrode terminals formed on a pair of circuit substrates to be connected, comprising: dispersing charged electroconductive particles onto at least one of the circuit substrates to selectively attach the electroconductive particles onto the electrode terminals thereof, and sandwiching the electroconductive particles between the electrode terminals of the pair of circuit substrates to mutually connect the electrode terminals electrically. Herein, the term circuit substrate is intended to cover an electrical element, such as a semiconductor device or IC chip having electrode terminals for connection formed thereon.

According to a second aspect of the present invention, there is provided a method of mutual connection of electrode terminals for electrically connecting and mutually fixing an electrode terminal formed on a first electrical circuit substrate and an electrode terminal formed on a second circuit substrate, comprising: dispersing electroconductive particles onto at least one of the first and second circuit substrates to selectively attach the electroconductive particles onto the electrode terminal formed thereon, and then bonding the electrode terminal formed on the first circuit substrate with the electrode terminal formed on the second circuit substrate.

According to a third aspect of the present invention, there is provided a method of mutual connection of electrode terminals for electrically connecting and mutually fixing an electrode terminal formed on a first electrical circuit substrate and an electrode terminal formed on a second circuit substrate, comprising: charging electroconductive particles by passing the electroconductive particles through a charging zone in which a charging electric field is formed; dispersing electroconductive particles onto at least one of the first and second circuit substrates to selectively attach the electroconductive particles onto the electrode terminal formed thereon, and then bonding the electrode terminal formed on the first circuit substrate with the electrode terminal formed on the second circuit substrate.

According to a fourth aspect of the present invention, there is provided a method of connecting a semiconductor device to a circuit substrate after positional alignment between electrode pads of the semiconductor device and electrode terminals of the circuit substrate, comprising: applying a paste comprising a mixture of an electroconductive resin and electroconductive particles onto at least one of the electrode pads of the semiconductor device and the electrode terminals of the circuit substrate, and hardening the electroconductive resin while pressing the electrode pads of the semiconductor device against the electrode terminals of the circuit substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
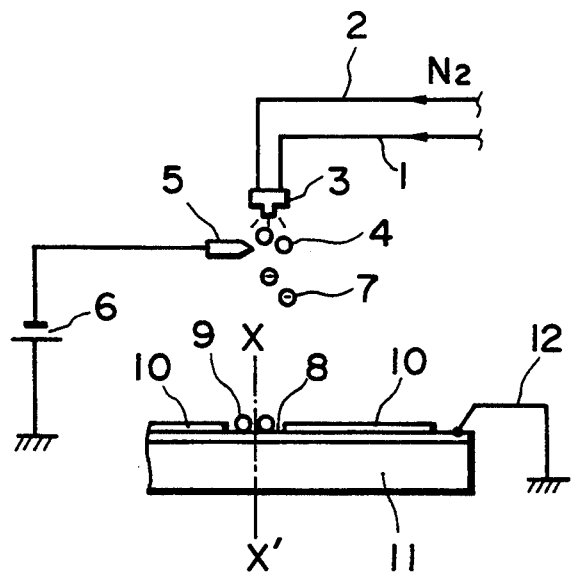
FIG. 1 is a schematic view illustrating a manner of dispersing electrophotographic particles according to the present invention.

According to the present invention, when electroconductive particles are dispersed and attached to electrode terminals of circuit substrates to be mutually connected, the electroconductive particles are selectively attached to the electrode terminals, so that the electrode terminals disposed at a high density on the circuit substrates are mutually connected while ensuring insulation between adjacent electrode terminals.

In the present invention, in order to attach electroconductive particles preferentially to the electrode terminals, the electroconductive particles are charged and dispersed in an electrostatic field concentrated at the electrode terminals so as to control the position where the electroconductive particles are attached, thus attaching a larger amount of the electroconductive particles to the electrode terminals.

The electroconductive particles may be charged by corona discharging or triboelectrification through friction with an insulating or semiconductor material. Further, by coating the electrode terminals except for the connecting parts thereof with an insulating film, the electric field may be concentrated at the connecting parts of the electrode terminals so that the electroconductive particles can be selectively attached to the connecting parts.

If resin particles coated with an electroconductive plating are used as the electroconductive particles, the electrode terminals are allowed to have a lower specific gravity so that they can be easily guided to the electrode terminals, and a stress acting at the connected parts can be alleviated after the mutual connection of the circuit substrates.

Further, in the case of connecting a semiconductor device to a circuit substrate, the connection may be effected without using bump contacts on the semiconductor device by dispersing and selectively attaching electroconductive particles to the electrode terminals on the circuit substrate, aligning the electrode pads of the semiconductor device and bonding them with an adhesive.

Further, in the present invention, in the case where a semiconductor device is connected to a circuit substrate, a part of the circuit substrate facing the die edge of the semiconductor device may be covered with an insulating film, whereby the electroconductive particles may be dispersed so that they are not attached to the part facing the die edge.

In some cases of the above-mentioned selective dispersion for connection of electrode terminals, it may be difficult to set the process conditions for preventing the electrode terminals from being dispersed on the insulating film, and some electroconductive particles dispersed on the insulating film can constitute a capacitive load by the medium of the insulating film between the die edge (substrate) of an IC chip and the circuit substrate pattern to result in an electrical failure and a low production yield.

In a further preferred embodiment of the method of mutually connecting electrode terminals according to the present invention, it is possible to lower the production cost and decrease the occurrence of electrical failure. In the preferred embodiment, charged electroconductive particles are dispersed on at least one of a circuit substrate and the other circuit substrate or electrical element to be connected to each other so as to selectively attach the electroconductive particles to the electrode terminals thereof, and the electroconductive particles are sandwiched between the electrode terminals of both substrates so as to mutually connect the electrode terminals, wherein an insulating mask is disposed to cover a part to which the electroconductive particles need not be attached at the time of selective dispersion of the electroconductive particles.

The insulating mask may for example be applied onto a circuit substrate by means of an adhesive.

The thickness, dielectric constant and shape of the insulating mask may be appropriately selected in view of factors, such as the charge, quantity, dispersion pressure, dispersion height and selectivity of dispersion and attachment of the electroconductive particles.

In order to selectively disperse and attach electroconductive particles onto electrode terminals of a circuit substrate to be connected, an electric field directed to electrode terminals may be generated so that electroconductive particles are guided to the electrode terminals and, as the part to which electroconductive particles are not dispersed (non-selection region) is covered by an insulating mask, the electroconductive particles are prevented from being attached to patterned electrodes extending from the electrode terminals of the circuit substrate, and electroconductive particles are attached to only the desired portion of the electrode terminals.

As the electroconductive particles are dispersed for selective attachment after an insulating mask is intimately disposed, a thick insulating film of a high dielectric constant need not be formed on a circuit substrate but a thin insulating film, if used, is sufficient or such an insulating film can be omitted depending on the usage, so that the connection is performed at a low cost. Further, in the case of connection of electronic parts or elements such as IC chips, the electroconductive particles are attached to only desired parts on the electrode terminals at a high selectivity, so that the connection may be performed without the occurrence of a short circuit between the die edge part of an IC chip and the electrode pattern on the circuit substrate or an electrical failure due to the formation of a capacitive load in combination with an insulating film.

Hereinbelow, some embodiments of the invention will be explained with reference to the drawings.

FIG. 1 is a schematic view illustrating a system of dispersing electroconductive particles according to an embodiment of the present invention.

Referring to FIG. 1, the system includes a line I for introducing a liquid dispersion of electroconductive particles, a line 2 for introducing liquid nitrogen, a discharge nozzle 3, an electrical discharge electrode 5, a high-voltage power supply 6 connected to the discharge electrode 5 for forming a corona electric field, a circuit substrate 11, an electrode terminal 8 on the circuit substrate 11, a mask 10 covering a prescribed part of the circuit substrate 11 and a grounding line 12 connected to the electrode terminal 8.

In an operation for dispersing electroconductive particles onto the circuit substrate by using the system, the liquid dispersion of electroconductive particles supplied through the line 1 is sprayed for dispersion through the discharge nozzle 3 under the action of the compressed nitrogen supplied through the line 2 to form electroconductive particles 4, which are then passed to be charged through a corona electric field formed by the discharge electrode. The thus-formed charged electroconductive particles 7 are guided along electric lines of force in an electrostatic field formed between the discharge electrode 5 and the grounded lead electrodes 8 on the circuit substrate 11, to be attached to the connecting part of the lead electrodes 8.

Figure 2:
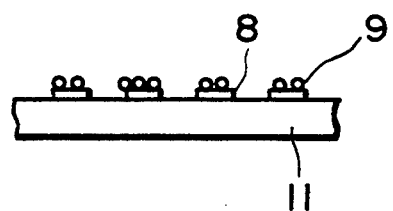
FIG. 2 is a schematic sectional view taken along the line X-X' in FIG. 1 showing a state where electroconductive particles are selectively attached to electrode terminals through dispersion.

FIG. 2 is a sectional view taken along the line X-X' in FIG. 1, wherein the electrode terminals attached to the lead electrodes 8 are denoted by a reference numeral 9. As shown in FIGS. 1 and 2, according to this method, the electroconductive particles can be selectively dispersed to be concentrated on the part used for connection of the electrode terminals 8, so that the connection is performed with a high degree of insulation between adjacent electrodes.

Then, an embodiment of connecting a semiconductor device for driving a liquid crystal device to lead electrodes on a glass substrate of the liquid crystal device will be explained with reference to FIGS. 3-5. Referring to these figures, in this case, connecting parts a and b are formed on pattern electrodes (electrode terminals) 13 on a glass substrate 11, the pattern electrodes 13 except for the connecting parts a and b are covered with an intimately disposed insulating mask (insulating film) 10, and electroconductive particles 9 are dispersed in a manner as shown in FIG. 1 to be selectively attached to the connecting parts a and b.

Figure 4:
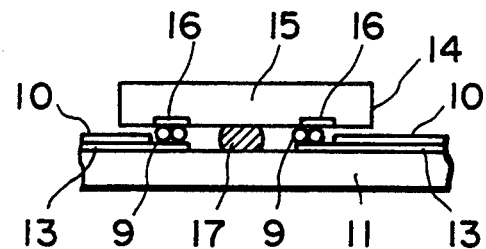
FIG. 4 is a sectional view showing a state where a semiconductor device is aligned to the liquid crystal substrate shown in FIG. 3 and a part of the semiconductor device is bonded by an adhesive for electrical connection.

Then, as shown in FIG. 4, electrode pads 16 of a semiconductor device 15 are aligned with the glass substrate 11, and an adhesive 17 applied at parts other than the connecting parts is hardened or cured while applying a pressure between the semiconductor device 15 and the substrate 11, thereby to electrically connect the electrode terminals of the liquid crystal device and the electrode pads of the semiconductor device. After curing the adhesive 17, the electrical connection is ensured even if the pressure is released, so that the operation of the semiconductor device can be tested in this state. If the adhesive 17 is one which can be released by application of heat, cooling, ultrasonic wave or solvent, the semiconductor device connected as described can be removed and easily replaced by a new one if the inadequacy of the connected device is found by the operation test at this stage.

Figure 5:
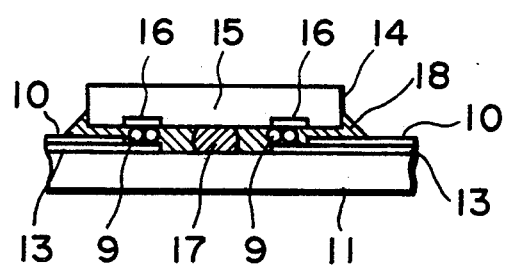
FIG. 5 is a sectional view showing a state where the non-bonded part between the semiconductor device and the liquid crystal substrate shown in FIG. 4 is bonded and sealed by an adhesive.

FIG. 5 shows a state wherein the non-bonded parts between the semiconductor device and the glass substrate after the operation test of the semiconductor device are bonded and sealed up by an adhesive 18 comprising mainly a thermosetting resin.

Figure 3:
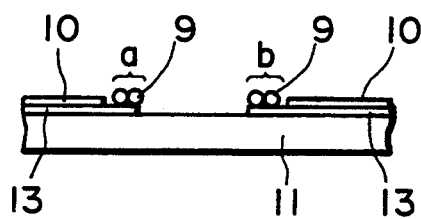
FIG. 3 is a schematic sectional view showing a state wherein electroconductive particles are selectively attached to electrode terminals on a liquid crystal substrate through dispersion according to an embodiment of the present invention.

As shown in FIGS. 3-5, when the part of a lead electrode opposite to the die edge 14 of the semiconductor device is covered by the insulating film 10 and electrode terminals are dispersed in a manner as shown in FIG. 1, the electrode terminals are not attached to the part facing the die edge of the semiconductor device, so that the short circuit can be prevented between the die edge 14 of the semiconductor device and the lead electrode 13 of the liquid crystal substrate.

Figure 6:
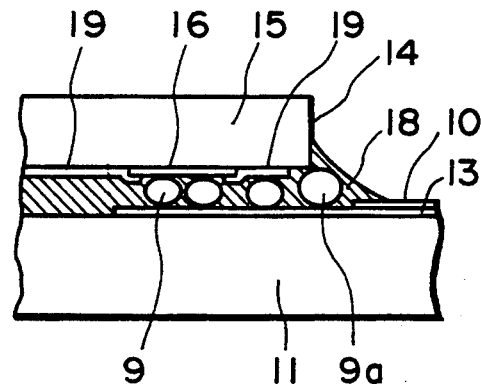
FIG. 6 is a sectional view showing a state where a short circuit is formed at edges between a semiconductor device and a liquid crystal substrate.

For comparison, FIG. 6 schematically shows a state wherein edge short circuit between the die edge of a semiconductor device and a lead electrode of a liquid crystal substrate is caused by an electroconductive particle in case where the lead electrode on the liquid crystal substrate facing the die edge of the semiconductor device is not covered by such an insulating film. More specifically, FIG. 19 shows a passivation film formed on the semiconductor device and shows a state where an electroconductive particle 9a causes a short circuit between the die edge 14 and the lead electrode 13.

In the present invention, it is possible to use metal particles as the electroconductive particles for selective scattering and electrical connection, but those formed by coating resin particles with an electroconductive plating can be more easily guided along electric lines of force because of a smaller specific gravity than metal particles. Further, as for the electrical connection by the contact with the electroconductive particles, the resin particles can relax stress acting at the contacts to provide improved reliability.

Figure 7:
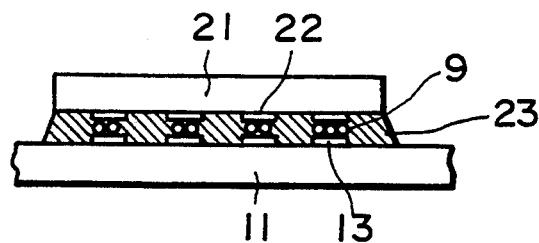
FIG. 7 is a sectional view showing a state where electrode terminals of a liquid crystal substrate and a flexible circuit substrate are connected by another embodiment of the present invention.

FIG. 7 shows another embodiment of the present invention, wherein electroconductive particles 9 are attached to electrode terminals 13 on a glass substrate 11 of a liquid crystal device, electrode terminals 22 on a flexible circuit substrate 21 are aligned with the electrode terminals 13 on the glass substrate 11, and an adhesive 23 is cured under pressure to effect the connection.

The adhesive 23 may comprise a thermoplastic resin, a thermosetting resin or mixture of a thermosetting resin and a thermoplastic resin.

The adhesive 23 may be supplied by applying a liquid adhesive at the periphery of the flexible circuit substrate 21 so as to cause the penetration thereof from the periphery, by applying, screen-printing or transferring an adhesive onto one or both of the flexible circuit substrate 21 and the liquid crystal substrate 11, by interposing an adhesive in the form of a sheet between the flexible substrate 21 and the liquid crystal substrate 11, or by applying an adhesive in the form of a sheet onto one or both of the flexible circuit substrate 21 and the liquid crystal substrate 11.

Figure 8:
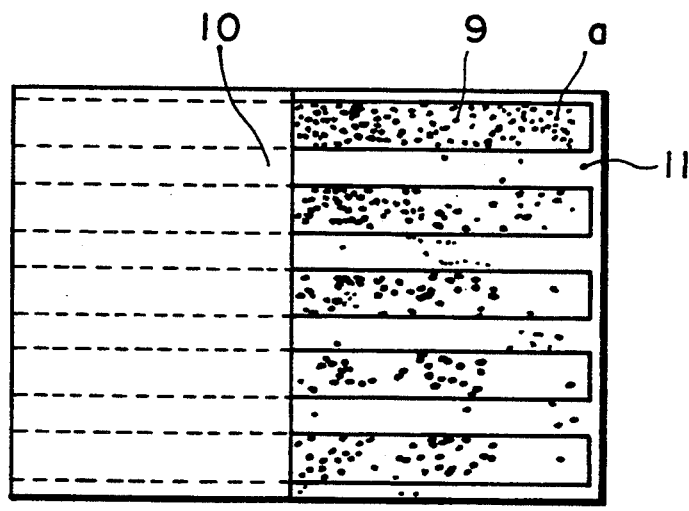
FIG. 8 is a plan view showing a state where electroconductive particles are selectively attached according to a selective dispersing method by the invention.

FIG. 8 is a plan view showing a state wherein electroconductive particles were dispersed and attached in a specific embodiment of the present invention. As shown in FIG. 8, electroconductive particles 9 were attached to the connecting parts a of the patterned electrodes and not to the insulating parts (the circuit substrate 11 and the insulating mask 10). As a result of the dispersion under the following conditions, the selectivity of dispersion between the electrode patterns (ratio of the number of electroconductive particles dispersed and attached to the connecting parts/the number of electroconductive particles dispersed and attached to the insulating parts of the circuit substrate) was about 50 and the selectivity between the connecting parts and the insulating mask was substantially ∞ (infinity).

Electroconductive particles: "MICROPEARL Ni" (mfd. by Sekisui Fine Chemical K.K.). Diameter=10 microns. Coated with a 0.06 micron-thick Ni layer.
Charging voltage: 45 kV
Dispersion height: 300 mm
Dispersing pressure: 3.0 kg.f/cm$^2$
Insulating mask: 125 micron-thick polyimide film In general, electroconductive particles may preferably have a volume-average particle size of 0.1–50 microns, particularly 1–20 microns, and the electroconductive coating thickness thereof may preferably be $1\times10^{-4}$ to $5\times10^{-2}$ times, particularly $1\times10^{-3}$ to $1\times10^{-2}$ times, the average particle size of the electroconductive particles. Electroconductive particles may preferably be substantially spherical. Another commercial available embodiment may include "MICROPEARL Au" (mfd. by Sekisui Fine Chemical K.K.).

Figure 9:
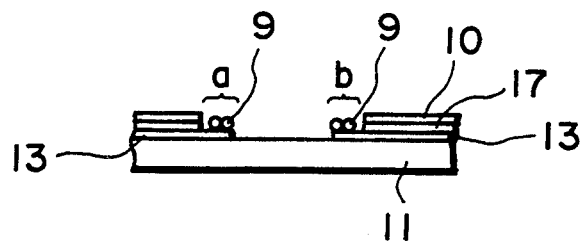
FIG. 9 is a sectional view showing another embodiment of the invention.

FIG. 9 shows a modification of the embodiment shown in FIG. 3. In this case, an insulating mask 10 is applied to a circuit substrate 11 by the medium of an adhesive, whereby the insulating mask need not be repetitively removed.

In the above embodiments, a semiconductor device for driving a liquid crystal device is connected to lead electrodes formed on a glass substrate of the liquid crystal device by the face-down bonding mode.

Another embodiment of connecting a semiconductor device for driving a liquid crystal display device to lead electrodes formed on a glass substrate of the liquid crystal display device according to the face-down bonding mode will now be described.

Figure 10:
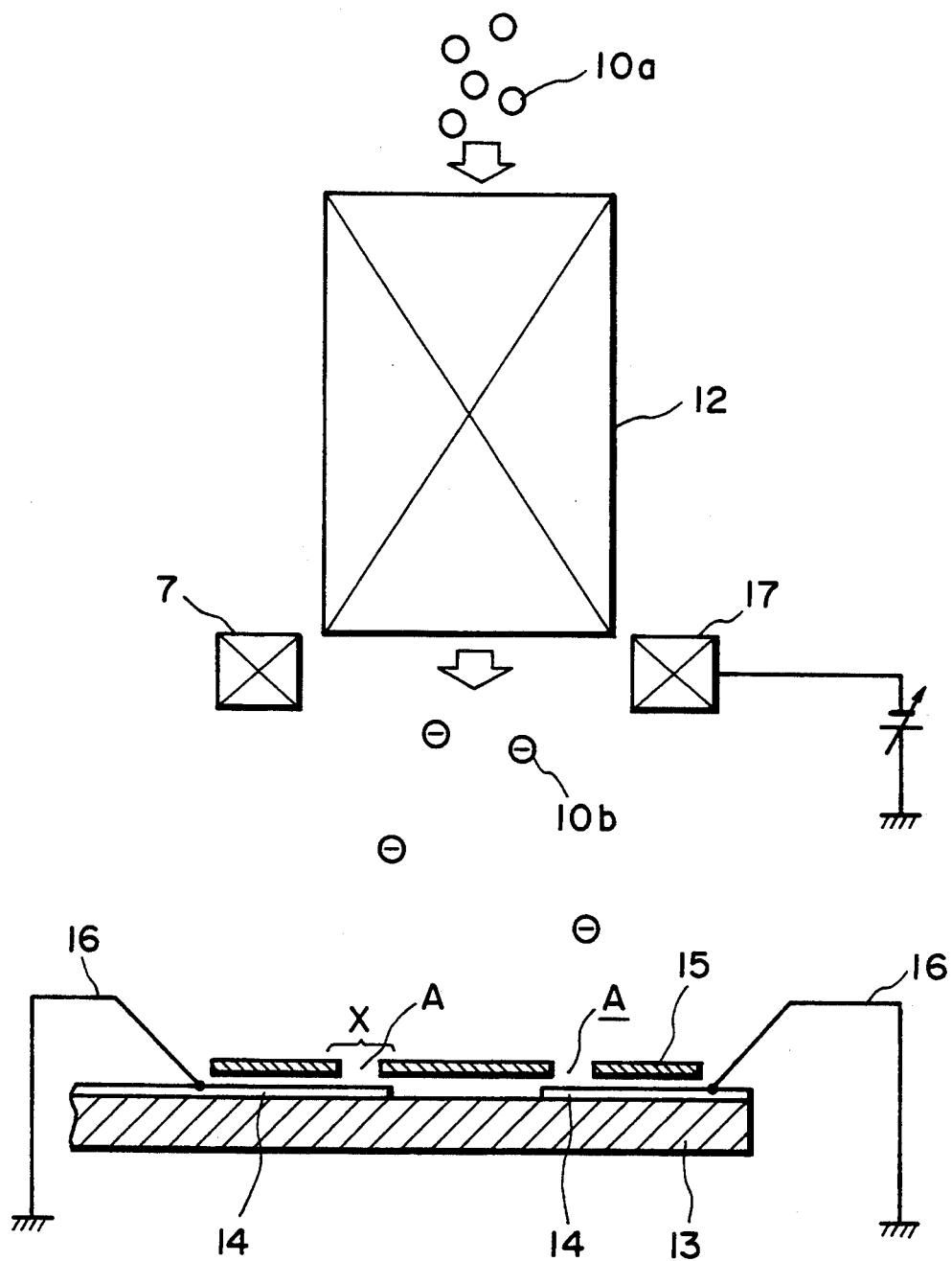
FIG. 10 is a schematic view showing a manner of charging and dispersing electroconductive particles onto electrode terminals of a circuit substrate.

FIG. 10 is a schematic view of an apparatus according to the present invention. Referring to FIG. 10, electroconductive particles comprising plastic beads (having an average particle size of 0.1–100 microns) coated with a film of, e.g., gold, silver, aluminum, nickel, chromium or an alloy of these metals are charged to form charged particles 10b while they are passed through a single-polarity bi-directional particle charger 12 called a boxer charger (e.g., one available from Masuda Kenkyusho, Co. Ltd., Japan). The system further includes a glass substrate for a liquid crystal display device, lead-electrodes 14 formed on the substrate, an insulating film 15 having an opening A exposing the connecting parts of the lead electrodes 14, grounding lines 16 for the lead electrodes 14 and an external power supply 17.

As shown in FIG. 10, the lead electrodes 14 formed on the glass substrate 13 are grounded, the lead electrodes 14 are covered with the insulating film 15 except for the connecting parts thereof, and then the electroconductive particles 10a charged by means of the boxer charger (particle charger) to be dispersed onto the lead electrodes 14.

Figure 11:
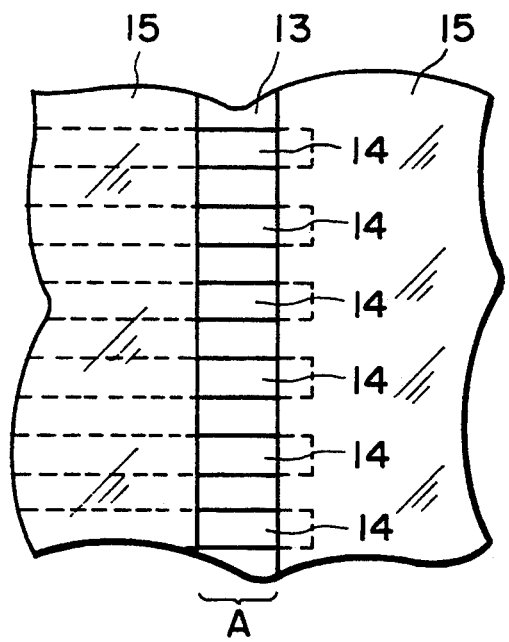
FIG. 11 is a view of the part X observed from the above in FIG. 10.

FIG. 11 is a partial plan view of a part X in FIG. 10 from above.

As the charged particles 10b approach the glass substrate 13, the electroconductive particles 10b in the vicinity of the opening A of the insulating film cause an image force acing in the neighborhood of the lead electrodes 14 and therefore are preferentially attached to the lead electrodes 14.

At this time, it is also possible to form an electric field between the external supply 17 and the lead electrodes so as to guide the charged electroconductive particles 10b to the lead electrodes 14 due to an electrostatic force.

Figure 12:
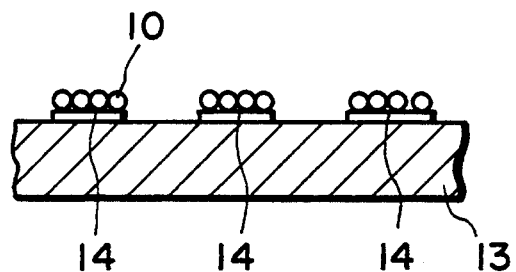
FIG. 12 shows a state where charged electroconductive particles are selectively attached to electrode terminals on a glass substrate.
Figure 13:
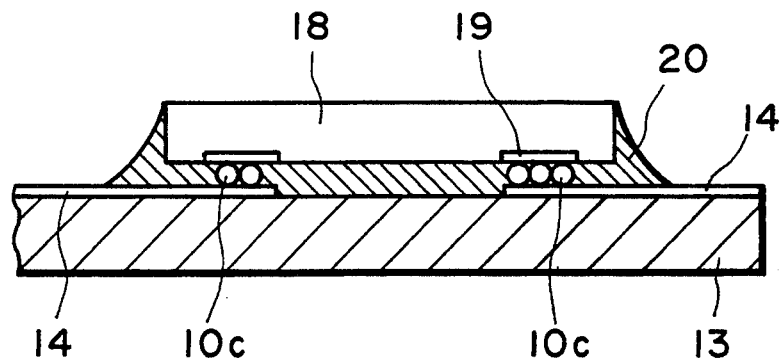
FIG. 13 shows a state where electrode terminals are attached to electrode terminals on a glass substrate, then a semiconductor device is aligned in the face-down mode and they are fixed to each other with an insulating adhesive.

FIG. 12 shows a state wherein charged electroconductive particles 10c (corresponding to electroconductive particles 10b shown in FIG. 10) are attached to the lead electrodes 14.

Then, the insulating film 15 is removed and electrode pads 19 of a semiconductor device 18 are aligned with its face directed downward with the lead electrodes 14, and an insulating adhesive 20 is cured under pressure to effect the connection.

Figure 14:
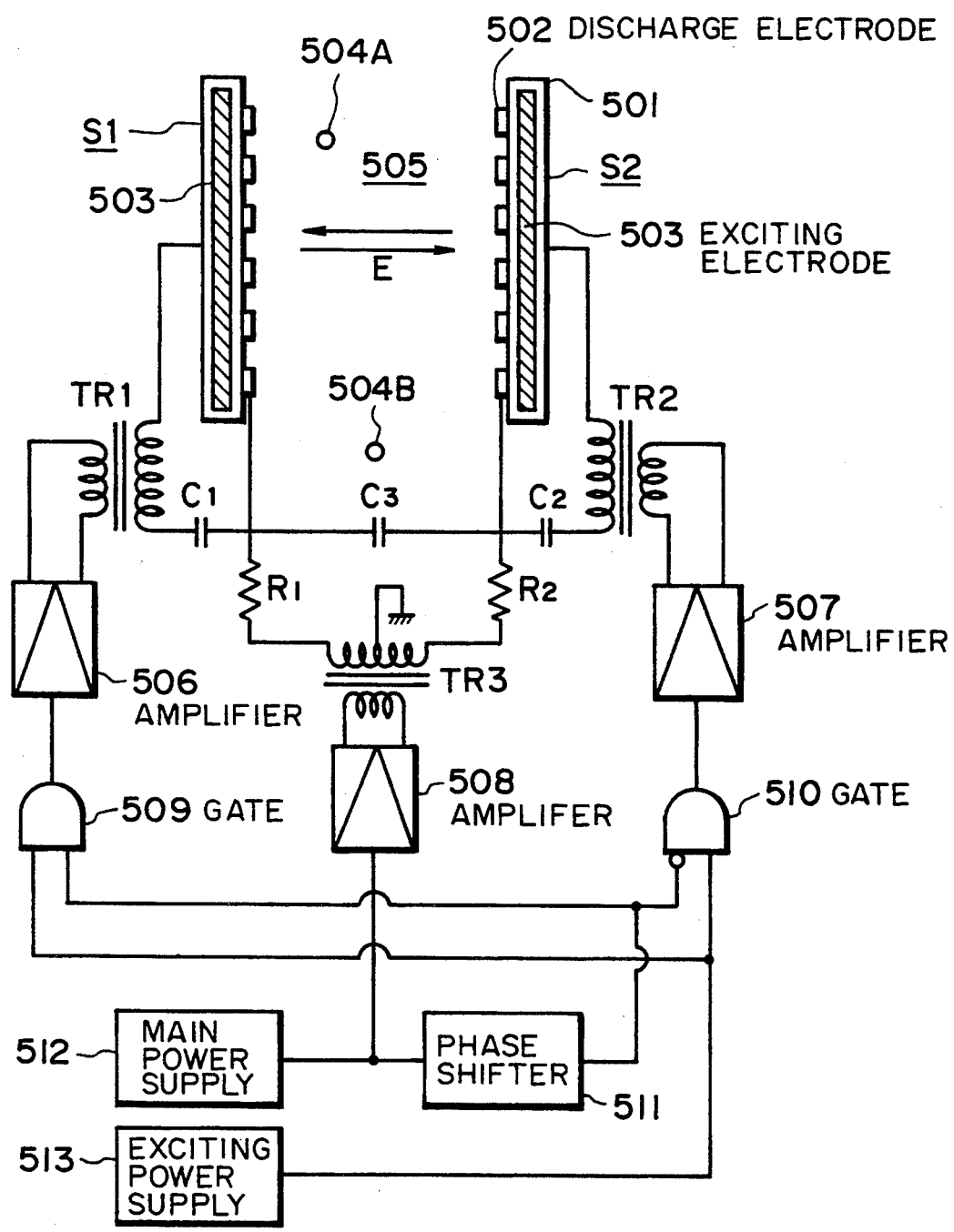
FIG. 14 is a schematic sectional view illustrating a boxer charger used in the present invention.
Figure 15:
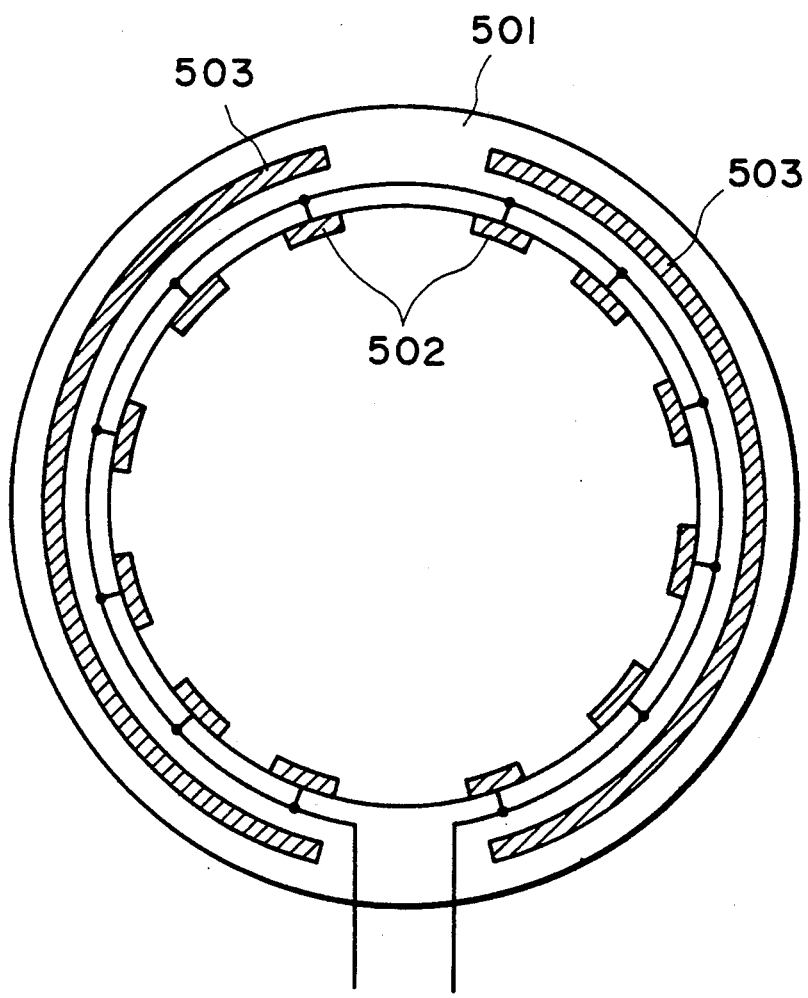
FIG. 15 is a plan view thereof.

FIG. 14 is a schematic sectional view of the boxer charger used in the present invention, and FIG. 15 is a plan view thereof.

Referring to the figures, the system includes a ceramic cylinder 501, discharge electrodes 502, exciting electrodes 503, electroconductive particles 504A, charged electroconductive particles 504B, a charging zone (charging space) 505, a charging electric field E, exciting transformers TR1 and TR2, a main transformer TR3, amplifiers 506, 507 and 508, gates 509 and 510, a phase shifter 511, a main power supply 512 of 500 Hz, and an exciting power supply 513 of 20 kHz.

The charging electric field E is formed by applying an AC voltage of 500 Hz from the main power supply 512 to the discharge electrodes 502. If a high-frequency AC voltage of 20 kHz is applied to the exciting electrodes 503 when the discharge electrodes 502 on the $S_1$ side are negative, a planar plasma ion source is formed due to surface discharge, and only negative ions are pulled out due to the electric field, fly through the charging space and are absorbed at the non-excited surface on the side $S_2$. During this period, the negative ions collided against the particles 504A from the left thereof to charge the particles. Next, when the voltage polarity is inverted and the discharge electrodes 502 on the $S_2$ side are negative, only the side $S_2$ is excited to discharge negative ions, which collide at the particles 504A from the right to charge the particles. In this way, ions collide at the particles 504A alternately from the left or from the right to charge the particles 504A, so that the particles 504A can be quickly charged to a high saturation value even if the particles 504A have a very high electrical resistance. The thus charged particles 504B only oscillate with a small amplitude so that they are not attached to one electrode in a large amount as are in a DC electric field.

In a preferred embodiment, the distance between $S_1$ and $S_2$ may be set within the range of 1-10 cm, preferably 2-5 cm, and the height of the ceramic cylinder may be set within the range of 3-20 cm, preferably 5-10 cm.

Figure 16A:
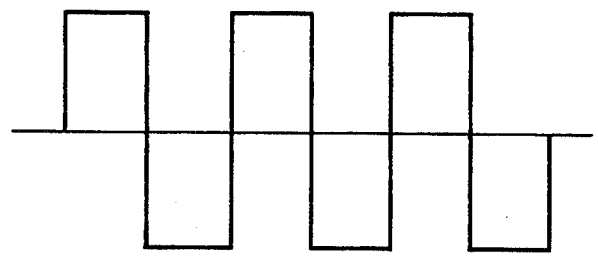
FIGS. 16A–16C are time charts showing drive voltage waveforms used in the apparatus.
Figure 16B:
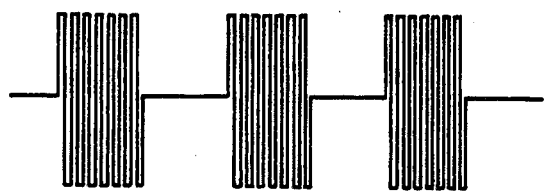
Figure 16C:
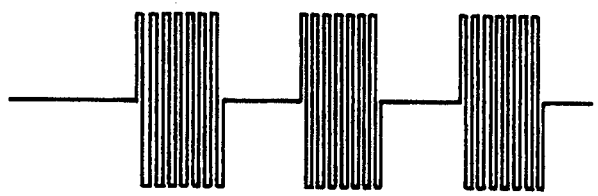

FIGS. 16A-16C show a voltage waveform applied between the discharge electrodes on the sides $S_1$ and $S_2$, a voltage waveform applied to the exciting electrode 503 on the $S_1$ side, and a voltage waveform applied to the exciting electrode 504, respectively, shown on a common time scale.

According to another embodiment of the present invention, a semiconductor device may be connected to a circuit substrate in the face-down bonding mode by applying a paste mixture comprising electroconductive particles (preferably spherical ones) and an electroconductive resin onto at least one of the electrode pads of the semiconductor device and the electrode terminals of the circuit substrate, positionally aligning the electrode pads of the semiconductor device and the electrode terminals of the circuit substrate, and applying at least one type of energy such as heat, ultraviolet rays and radiations to cure the electroconductive resin while pressing the semiconductor device onto the circuit substrate, to electrically connect the electrode pads of the semiconductor device with the electrode terminals of the circuit substrate.

According the above-described method of connecting the semiconductor device, the electroconductive particles are sandwiched between the electrode pads of the semiconductor device and the electrode terminals of the circuit substrate, whereby the spacing between the electrode pads of the semiconductor device and the electrode terminals of the circuit substrate may be specifically set and the electrode pads of the semiconductor device and the electrode terminals of the circuit substrate are electrically connected to each other. Further, the electroconductive resin functions to hold the spacing between the electrode pads of the semiconductor device and the electrode terminals of the circuit substrate and also supplements the electrical connection therebetween.

If the electroconductive particles comprise preferably spherical resin particles coated with an electroconductive plating, the contact area between the electrode pads of the semiconductor device and the electrode terminals of the circuit substrate can be increased and further the stress at the connecting parts can be alleviated.

Figure 17:
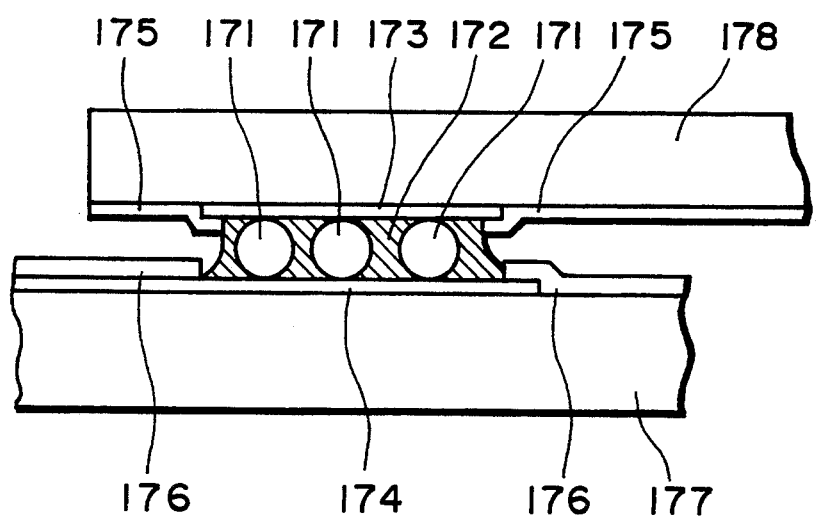
FIG. 17 is a sectional view showing an electrically connecting part where a semiconductor device is connected to lead electrodes of a circuit substrate by the face-down mode.

FIG. 17 illustrates such an embodiment according to the connection method of the present invention, particularly a state of a connecting part in a case where a semiconductor device is connected to lead electrodes of a circuit substrate by the face-down bonding mode.

For the connection, a paste comprising a mixture of electroconductive particles 171 and an electroconductive resin 172 is disposed between electrode pads 173 of a semiconductor device 178 and lead electrodes 174 of a circuit substrate 177 (by application to either one or both sides), the circuit substrate 178 is pressed so that spacing between the electrode pads 173 and the electrode terminals 174 becomes even smaller than the average particle size of the electroconductive particles 171, and the electroconductive resin 172 is hardened while the electroconductive particles 171 are sandwiched between the electrode pads 173 and the electrode terminals 174, followed by releasing the pressure.

The electroconductive resin may be hardened by heating if it is of a thermosetting type. If the electroconductive resin 172 contains a thermoplastic resin, the semiconductor device can be removed relatively easily when some disorder is found after the hardening of the electroconductive resin 172.

When the base substrate 177 of the circuit substrate is transparent, it is possible to use an ultraviolet-curable electroconductive resin for the electroconductive resin 172. In this case, the semiconductor device is pressed so as to sandwich the electroconductive particles 171 between the electrode pads 173 and the electrode terminals 174, and in this state, the electroconductive resin 172 is cured by irradiation with ultraviolet rays emitted through the base substrate 177 from the lower side.

In this embodiment, resin particles coated with a metal plating are used as the electroconductive resins 171 but spherical metal particles may also be used.

Further, if the spherical electroconductive resins having a standard deviation in particle size of below 1 micron are used, the spacing between the electrode pads 173 and the electrode terminals 174 can be made constant and the connection resistance by the contact with electroconductive particles can be made stable.

FIGS. 18A-18D show an embodiment of connecting a semiconductor device for driving a liquid crystal device to lead electrodes on a glass substrate of the liquid crystal device in the face-down bonding mode.

Figure 18A:
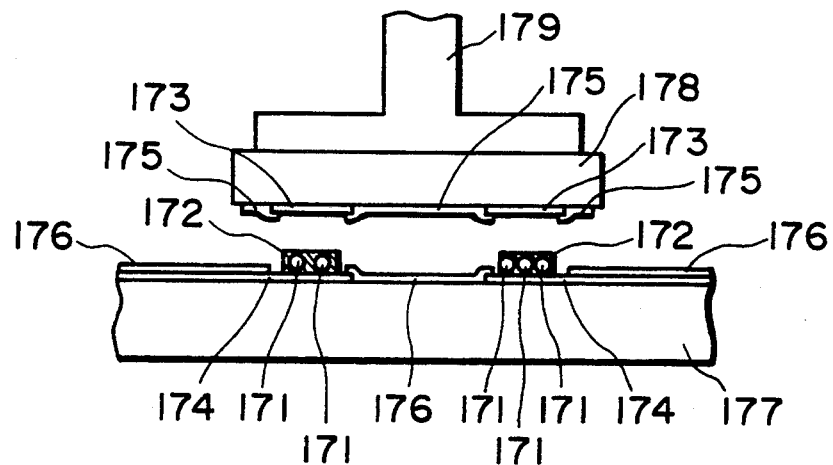
FIG. 18A is a view showing a state where a paste comprising a mixture of electroconductive spherical particles and an electroconductive resin is disposed on electrode terminals on a glass substrate of a liquid crystal device, and electrode pads of a semiconductor device are aligned to the lead electrodes on the glass substrate.

First of all, as shown in FIG. 18A a paste comprising a mixture of electroconductive particles 171 obtained by coating spherical resin particles with a Ni plating and an electroconductive resin 172 of an ultraviolet-curable-type containing Ag powder as an electroconductive element is applied on lead electrodes 174 formed on a glass substrate 177 of a liquid crystal device, and electrode pads 173 of a semiconductor device are aligned with the electrode terminals 174.

Figure 18B:
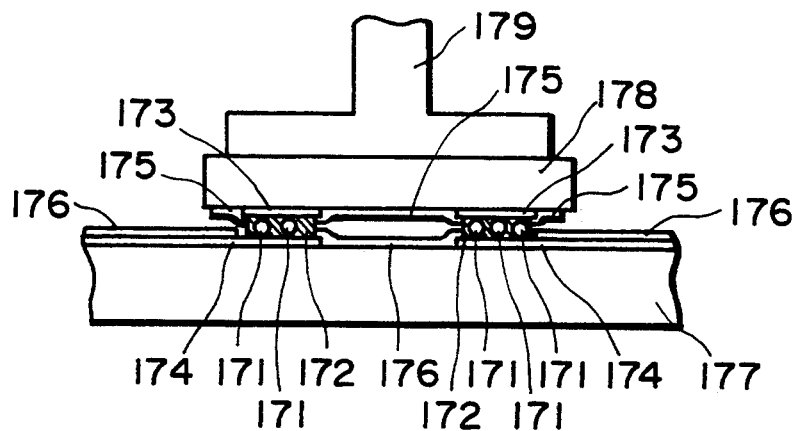
FIG. 18B is a view showing a state where the aligned semiconductor device is held under pressure by a pressure bonding means.

Thereafter, as shown in FIG. 18B, the semiconductor device 178 is pressed by a pressing member 179 so as to sandwich and hold the electroconductive particles 171 between the electrode pads 173 and the electrode terminals 174 on the glass substrate 177. In this state, the electroconductive resin 172 is hardened by irradiation with ultraviolet rays entering from below the glass substrate to electrically connect the electrode pads 173 of the semiconductor device and the electrode terminals 174 on the glass substrate. After the hardening of the electroconductive resin 172, the pressure from the pressing member 179 may be released while retaining the electrical connection. At this stage, an operation test of the semiconductor device may be performed, and if some operation failure is found, the semiconductor device can be removed by some means such as heating, cooling, application of ultrasonic waves or a solvent, followed by connection of a new semiconductor device.

Figure 18C:
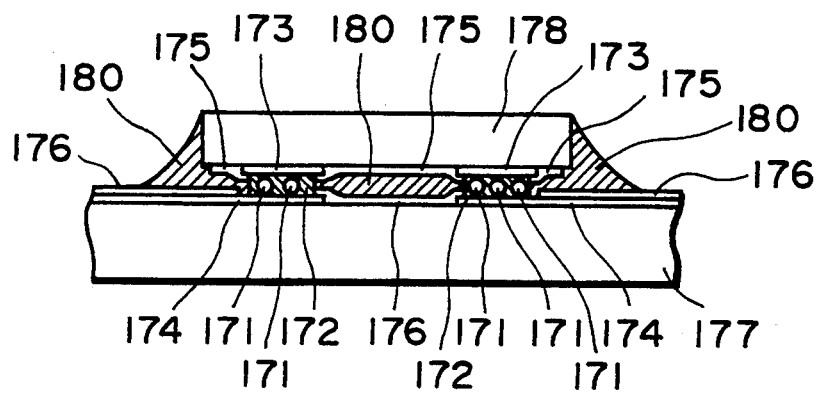
FIG. 18C is a view showing a state where the electroconductive resin is hardened and then the non-bonded part between the semiconductor device and the glass substrate is bonded and sealed.

After the operation test of the semiconductor device, as shown in FIG. 18C, an adhesive 180 comprising principally a thermosetting resin is applied for bonding and sealing of the non-bonded parts between the semiconductor device and the glass substrate.

In this embodiment, it is also possible to use a thermosetting electroconductive resin as the electroconductive resin 172.

According to the connection method as described above, the following effects will be accomplished.

Electroconductive (fine) particles may be attached to a circuit substrate through dispersion, so that the attachment of the electroconductive particles can be effected without restriction by the shape or arrangement of the connecting electrode on the circuit substrate.

Further, electroconductive particles may be charged and then dispersed in an electrostatic field formed with exposed electrode terminals on a circuit substrate so as to attach the electroconductive particles selectively to the electrode terminals, whereby an improved insulation between adjacent electrodes is attained.

By using electroconductive particles comprising resin particles coated with an electroconductive plating which have a smaller specific gravity than metal particles, the electroconductive particles are more effectively and selectively guided to the electrode terminals. Further, as the core of the electroconductive particles is composed of a resin, a stress acting at the connecting parts on the circuit substrate can be alleviated, while metal particles may also be used as electroconductive particles for selective dispersion and electrical connection.

Further, a semiconductor device may be connected to a circuit substrate by the face-down bonding mode without forming bump contacts on the semiconductor device, thus resulting in an improved production yield and a decreased production cost.

Further, by positionally aligning a semiconductor device and a circuit substrate, fixing a part of the semiconductor device with a releasable adhesive and then finally bonding the non-bonded part of the semiconductor device after an operation test of the semiconductor device, any semiconductor device which has been found awkward by the operation test can be easily removed.

Further, by disposing an insulating film at a part of a circuit substrate facing the die edge of a semiconductor device, the attachment of an electroconductive particle onto the part facing the die edge can be prevented so that it becomes possible to prevent short circuit between the semiconductor device and the circuit substrate.

Further, if electroconductive particles are selectively dispersed and attached by dispersing the particles after intimately disposing an insulating mask on a prescribed non-selected region so that a thick insulating film of a high dielectric constant formed on a circuit substrate can be made thinner or omitted depending on the use, whereby the cost of processing the circuit substrate can be remarkably lowered. Further, in the case of IC chip connection, it is possible to prevent the occurrence of a short circuit between the die edge of the IC chip and pattern electrodes of a circuit substrate and the formation of a capacitive load by the medium of an insulating film resulting in an electric failure.

When resin particles coated with an electroconductive plating are used as electroconductive particles for mutually connecting electrode terminals of circuit substrates, the resin particles can follow minute unevenness of the electrode terminals on a circuit substrate through their elastic deformation to ensure a stable connection Further, by fixing a pair of circuit substrates with an insulating adhesive after attaching electroconductive particles onto electrode terminals of at least one circuit substrate, a thinner connection may be effected by using fewer members.

When the present invention is applied to face-down bonding of a semiconductor device, the bonding can be performed without forming bump contacts on the semiconductor device, so that the bonding can be achieved inexpensively and without lowering the production yield.

Further, when a semiconductor device is connected to a circuit substrate by the face-down bonding mode with the use of a paste comprising a mixture of electroconductive particles and an electroconductive resin, a reliable connection can be attained without forming bump contacts on the semiconductor device so that an improved production yield and a decrease in production cost can be achieved with respect to the semiconductor device.

Further, by using spherical electroconductive particles comprising spherical resin particles coated with an electroconductive plating in combination with an electroconductive resin, a stress at the electrode-connecting parts between the semiconductor device and the circuit substrate can be alleviated to ensure a stable contact between the electroconductive particles and the electrodes and provide increased connection reliability.

What is claimed is:

1. A method of mutually connecting electrode terminals formed on a pair of circuit substrates to be connected, comprising the steps of:

charging electroconductive particles by passing electroconductive particles through a charging zone in space in which a corona electric field is formed by electric field discharge means;

dispersing the charged electroconductive particles in an electrostatic field formed between the discharge means and at least one of the electrode terminals to guide the charged electroconductive particles along electric lines of force in the electrostatic field, thereby selectively attaching the electroconductive particles onto the electrode terminals; and sandwiching the electroconductive particles between the electrode terminals of the pair of circuit substrates to electrically connect the electrode terminals.

2. A method according to claim 1, further comprising the step of, prior to the dispersing, covering a part of one of the circuit substrates not receiving the electroconductive particles with an insulating mask.

3. A method according to claim 2, further comprising the step of applying the insulating mask to said one of the circuit substrates with an adhesive.

4. A method according to claim 1, further comprising the step of coating a part of the electrode terminals that are not connected with an insulating film.

5. A method according to claim 1, wherein the electroconductive particles comprise resin particles coated with an electroconductive plating.

6. A method according to claim 1, wherein at least one of the circuit substrates comprises a semiconductor device.

7. A method according to claim 6, further comprising the step of covering a part of the circuit substrate to be connected with the semiconductor device and disposed opposite to a die edge of the semiconductor device with an insulating film.

8. A method according to claim 6, further comprising the steps of positionally aligning the electrode terminals of the semiconductor device for connection, bonding a part of the semiconductor device to the other circuit substrate with a first adhesive, and then bonding the non-bonded parts of the semiconductor device and the other circuit substrate for fixation with a second adhesive.

9. A method according to claim 1, wherein one of the pair of circuit substrates is a substrate comprising a liquid crystal panel.

10. A method of connecting electrode terminals for electrical connection and fixing an electrode terminal formed on a first electrical circuit substrate and a an electrode terminal formed on a second circuit substrate, comprising the steps of:
charging electroconductive particles by passing electroconductive particles through a charging zone in space in which a corona electric field is formed by electric field discharge means;
dispersing the charged electroconductive particles in an electrostatic field formed between the discharge means and at least one of the electrode terminals to guide the charmed electroconductive particles along electric lines of force in the electrostatic field, thereby selectively attaching the electroconductive particles onto the electrode terminals; and
bonding the electrode terminal formed on the first circuit substrate with the electrode terminal formed on the second circuit substrate.

11. A method according to claim 10, wherein the electroconductive particles are charged and then dispersed in a static electric field to concentrate attachment of the electroconductive particles onto the electrode terminal.

12. A method according to claim 10, wherein the electroconductive particles comprise resin particles coated with an electroconductive plating.

13. A method according to claim 10, further comprising the step of covering at least one of the first and second circuit substrates on which the electroconductive particles are dispersed with an insulating film on a portion other than the electrode terminal to be connected.

14. A method according to claim 13, further comprising the step of covering a part of the circuit substrate to be connected with the semiconductor device and disposed opposite to a die edge of the semiconductor device with an insulating film.

15. A method according to claim 10, wherein at least one of the circuit substrates comprises a semiconductor device.

16. A method according to claim 15, further comprising the steps of positionally aligning the electrode terminals of the semiconductor device for connection, bonding a part of the semiconductor device to the other circuit substrate with a first adhesive, and then bonding the non-bonded parts of the semiconductor device and the other circuit substrate for fixation with a second adhesive.

17. A method according to claim 10, wherein one of the first and second circuit substrates is a substrate comprising a liquid crystal panel.

18. A method of connecting electrode terminals for electrical connection and fixing an electrode terminal formed on a first electrical circuit substrate and an electrode terminal formed on a second circuit substrate, comprising the steps of:
charging electroconductive particles by passing electroconductive particles through a charging zone in space in which a corona electric field is formed by electric field discharge means;
dispersing the charged electroconductive particles in an electrostatic field formed between the discharge means and at least one of the electrode terminals to guide the charged electroconductive particles along electric lines of force in the electrostatic field, thereby selectively attaching the electroconductive particles onto the electrode terminals; and
bonding the electrode terminal formed on the first circuit substrate with the electrode terminal formed on the second circuit substrate.

19. A method according to claim 18, further comprising the steps of covering a non-connecting portion of the electrode terminal on a selected one of the first and second circuit substrates with an insulating member, and then dispersing the charged electroconductive particles so as to attach them onto the electrode terminal on the selected circuit substrate.

20. A method according to claim 18, wherein the electroconductive particles comprise resin particles coated with an electroconductive plating.

21. A method according to claim 18, further comprising the step of fixing the electrode terminal formed on the first circuit substrate with the electrode terminal formed on the second circuit substrate with an insulating adhesive.

22. A method according to claim 18, wherein the charging zone is formed by a boxer charger.

23. A method according to claim 18, wherein the charged electroconductive particles are dispersed in a static electric field to concentrate attachment of the electroconductive particles onto the electrode terminal.

24. A method according to claim 18, wherein one of the first and second circuit substrates is a substrate comprising a liquid crystal panel.

* * * * *

UNITED STATES PATENT AND TRADEMARK OFFICE
CERTIFICATE OF CORRECTION

PATENT NO. : 5,352,318
DATED : October 4, 1994
INVENTOR(S) : Takabayashi et al.

It is certified that error appears in the above-indentified patent and that said Letters Patent is hereby corrected as shown below:

On the title page item [56],

U.S. PATENT DOCUMENTS, insert the following:
--3,692,606  9/72  Miller et al.
  4,668,533  5/87  Miller--.

COLUMN 5:

Line 61, "I" should read --1--.

COLUMN 13:

Line 39, "a" (second occurrence) should be deleted.
Line 49, "charmed" should read --charged--.
Line 61, "the" should read --said--.

Signed and Sealed this

Fourth Day of April, 1995

BRUCE LEHMAN

*Attest:*

*Attesting Officer*     *Commissioner of Patents and Trademarks*